United States Patent [19]

Crewe

[11] 4,389,571
[45] Jun. 21, 1983

[54] MULTIPLE SEXTUPOLE SYSTEM FOR THE CORRECTION OF THIRD AND HIGHER ORDER ABERRATION

[75] Inventor: Albert V. Crewe, Palos Park, Ill.

[73] Assignee: The United States of America as represented by the United States Department of Energy, Washington, D.C.

[21] Appl. No.: 249,782

[22] Filed: Apr. 1, 1981

[51] Int. Cl.³ .............................................. G21K 1/08
[52] U.S. Cl. .............................. 250/396 R; 313/361.1
[58] Field of Search ........... 250/396 R, 396 ML, 306, 250/311; 313/361, 426

[56] References Cited

U.S. PATENT DOCUMENTS

| | | | |
|---|---|---|---|
| 3,753,034 | 8/1973 | Spicer | 250/396 R |
| 3,781,732 | 12/1973 | Wollnik | 250/396 R |
| 3,937,958 | 2/1976 | Rusch et al. | 250/396 R |
| 4,191,887 | 3/1980 | Brown | 250/396 R |
| 4,303,864 | 12/1981 | Crewe et al. | 250/396 R |

Primary Examiner—Bruce C. Anderson

[57] ABSTRACT

A means is provided for compensating for third and higher order aberration in charged particle beam devices. The means includes two sextupoles with an intermediate focusing lens, all positioned between two focusing lenses.

6 Claims, 19 Drawing Figures

MULTIPLE SEXTUPOLE SYSTEM FOR THE CORRECTION OF THIRD AND HIGHER ORDER ABERRATION

CONTRACTUAL ORIGIN OF THE INVENTION

The United States Government has rights in this invention pursuant to Contract No. EY-76-S-02-2398 between the U.S. Department of Energy and The University of Chicago.

BACKGROUND OF THE INVENTION

Charged particle beam systems, which are devices where an electron is brought to a final focus using magnetic or electrostatic lenses, have their performance limited at this time by fourth and higher order aberrations of the lenses. Examples of such electron beam devices are electron microscopes, electron microanalyzers, ion microscopes, and scanning transmission electron microscopes.

A system for correcting spherical or third order aberration of lenses in electron beam devices was shown and described in U.S. patent application Ser. No. 088,224, an invention of Albert V. Crewe and David A. Kopf, entitled "Sextupole System for the Correction of Spherical Aberration", filed Oct. 25, 1979 U.S. Pat. No. 4,303,864. In that application, a sextupole focusing arrangement was described for compensating for spherical aberration in charged particle beam devices. In that arrangement, a sextupole was positioned between two focusing lenses. The third order aberrations of a sextupole are cylindrically symmetric and of opposite sign to those of the upstream focusing lens. By producing a beam crossover in the center of the sextupole, its aberrations were used to correct the third-order aberration of the upstream round lens. However, no workable solution for eliminating higher than third order aberration in charged particle beam systems was known. These higher order aberrations limit the usefulness of charged particle beam devices in that probe sizes cannot be reduced below a specified minimum, the sizes of acceptable images are larger than desired, and magnification of the images must be limited to an unacceptably low level.

It is therefore an object of this invention to provide a means for compensating for third order, as well as higher than third order aberration in a charged particle beam system.

Another object of this invention is to provide a means for compensating for higher than third order aberration in charged particle beam systems having as few elements as possible, preferably no more than three elements.

Additional objects, advantages and novel features of the invention will be set forth in part in the description which follows, and in part will become apparent to those skilled in the art upon examination of the following, or may be learned by practice of the invention. The objects and advantages of the invention may be realized and attained by means of the instrumentalities and combinations particularly pointed out in the appended claims.

SUMMARY OF THE INVENTION

In an electron beam device in which an electron beam is focused in a final image plane, there is provided a means for eliminating spherical and higher-order aberrations. Two sextupole electromagnetic lenses are positioned between two extreme focusing lenses and an intermediate focusing lens is positioned between the two sextupole electromagnetic lenses. The downstream sextupole electromagnetic lens is operated so as to have a lesser strength than the upstream electromagnetic lens. Interaction of the sextupoles and lenses compensates for third and higher order aberrations.

DETAILED DESCRIPTION OF THE INVENTION

A sextupole is an electromagnetic focusing lens which can be generically described as having six electrodes or poles spaced symmetrically about and parallel to an optical axis, with each of the electrodes being of alternate polarity. As is well known, sextupoles can be electrical by being formed of parallel wires having currents passed therethrough, electrostatic by having voltages applied to plates, or magnetic by proper arrangement of the poles of a magnet. As described in U.S. Pat. No. 4,303,864 entitled, "Sextupole System for the Correction of Spherical Aberration," an invention of Albert V. Crewe and David A. Kopf, issued Dec. 1, 1981, U.S. Pat. No. 4,303,864, the third-order astigmatic aberrations of a single sextupole can be utilized to provide a spherical or third order aberration which is equal and opposite to third-order aberrations of a round lens. However, such systems did not correct fifth, seventh, and odd number higher order aberrations of the lens, and fourth, fifth, sixth and all higher order aberrations of the sextupole. Further, the odd number higher order aberrations of the sextupole are not equivalent to the higher order aberrations of the lens and cannot offer correction thereof. By utilizing the correction system of the invention, the aforementioned higher order aberrations can be eliminated or reduced with an improvement in the resolution in a probe-forming system. To the extent the prior application of Albert V. Crewe and David A. Kopf contains material necessary for this disclosure, it is hereby incorporated by reference.

An analysis of a sextupole's performance will be helpful in appreciating applicant's invention. The exact equations of motion of an electron in a sextupole can be written in rectangular coordinates as $$x'' = k((x^2-y^2)(1+x'^2) - 2xyx'y')(1+x'^2+y'^2)^{1/2}$$

$$y'' = -k(2xy(1+y'^2) - (x^2-y^2)x'y')(1+x'^2+y'^2)^{1/2}$$ (1)

where k is a parameter which indicates the strength of the sextupole $$k = \frac{B_r}{Rr^2}.$$

$B_r$ is the maximum magnetic field encountered at a radius r, R is the magnetic rigidity of the electrons in gauss cm. and all derivatives are with respect to z, the coordinate along the optic axis.

If only those terms up to third order are included, the equations reduce to $$x'' = k(x^2 - y^2).$$

$$y'' = -2kxy$$

and a solution in series can be obtained using an input amplitude $x_0, y_0$ and input slopes $$\frac{x_0\gamma}{z}, \frac{y_0\gamma}{z}.$$

The output of the sextupole is given by the following "output" equation $$x_1 = x_0(1+\gamma) + kz^2L(x_0^2 - y_0^2) + K^2z^4Mx_0(x_0^2 + y_0^2)\ldots$$

$$x'_1 = \frac{x_0\gamma}{z} + kzN(x_0^2 - y_0^2) + k^2z^3Px_0(x_0^2 + y_0^2)\ldots$$

$$y_1 = y_0(1+\gamma) - kz^2L(2x_0y_0) + k^2z^4My_0(x_0^2 + y_0^2)\ldots$$ (2)

$$y'_1 = \frac{y_0\gamma}{z} - kzN(2x_0y_0) + k^2z^3Py_0(x_0^2 + y_0^2)\ldots$$

where $L = 1/2 + \gamma/3 + \gamma^2/12$ $N = 1 + \gamma + \gamma^2/3$ $M = 1/12 + \gamma/12 + \gamma^2/30 + \gamma^3/252$ $P1/3 + 5\gamma/12 + \gamma^2/6 + \gamma^3/36$ and the only solution of interest is the case of $\gamma = -1$ which represents a beam crossover in the center of the sextupole. In this case $L = 1/6$ $N = 1/3$ $M = -1/252$ $P = -1/18$ and the condition of the beam at points of particular interest can now be calculated At the virtual source, which is at the center of the sextupole, $$x_s = x_1 - \frac{x'_1 z}{2} = \frac{k^2 z^4}{42} x_0(x_0^2 + y_0^2)$$

$$y_s = y_1 - \frac{y'_1 z}{2} = \frac{k^2 z^4}{42} y_0(x_0^2 + y_0^2)$$

which is a cylindrically symmetric virtual source with positive spherical aberration; that is, it is opposite in sign to that of a round lens.

If the existence of a field-free region of length $\rho z$ between the exit face of the sextupole and the principal plane of such a lens is assumed, the beam conditions in the principal plane can be calculated:

$$x_a = -x_0(1+2\rho) + \frac{kz^2}{6}(1+2\rho)(x_0^2 - y_0^2) -$$ (3)

$$\frac{k^2z^4}{252}(1+14\rho)x_0(x_0^2 + y_0^2)$$

$$y_a = -y_0(1+2\rho) - \frac{kz^2}{6}(1+2\rho)(2x_0y_0) -$$

$$\frac{k^2z^4}{252}(1+14\rho)y_0(x_0^2 + y_0^2)$$

The predominant terms in $x_a, y_a$ are the first ones in each case, and they lead to spherical aberration in the objective lens. Considering only these terms, the conditions at the image can be synthesized by summing the gaussian image of $x_s, y_s$ and the aberration term induced by $x_a, y_a$. For example, $$x_i = \frac{-2fx_s}{z(1+2\rho)} + \frac{C_s}{f^3} x_a(x_a^2 + y_a^2)$$

where $C_s$ is the coefficient of spherical aberration of the lens and f is its focal length. $x_i$ can be made zero by choosing $$k_0^2 = 21(1+2\rho)^4 \frac{s}{f^4 z^3}$$

With this choice, then, the effect of the spherical aberration coefficient ($C_s$) of the round lens in the final image is eliminated at least to third order.

If cylindrical coordinates in the entrance plane of the sextupole are used, the following approximation is given:

$$r_a = \alpha f(1 - E \cos 3\theta)^2$$

where $\alpha$ is the semi angle of convergence of the beam at the image and $$E = \frac{kz^2r}{3} 0.$$

Then the conditions at the image are given by $$r_i = C_s \alpha^3 \left[ (1 - E \cos 3\theta)^{\frac{3}{2}} - \frac{k^2}{k_0^2} \right].$$

It can be seen that the beam is not cylindrically symmetric in the aperture plane, but rather has a strong $3\theta$ dependence. This introduces additional aberrations in the image plane. Correction to third order can be made complete by choosing $k=k_0$ but higher order terms such as $r_0^4 \cos 3\theta$ will be introduced.

In the following, a specific lens is considered, having the values $f = 0.1$ cm $C_s = 0.04$ cm In the image plane, the effect of spherical aberration is to produce a disc of radius $C_s\alpha^3$. The extreme ray crosses the axis in front of the gaussian focus and the entire bundle of rays forms a beam which reaches a minimum radius of $$\frac{C_s\alpha^3}{4},$$

three quarters of the way between the gaussian focus and the extreme ray focus.

The optimum value for $\alpha(\alpha_0)$ can be calculated using wave optical theory and the optimum value is $$\alpha 0 = \left[\frac{4\lambda}{C_s}\right]^{\frac{1}{4}}$$

where $\lambda$ is the wavelength of the electrons. This choice allows just one wavelength of aberration.

Using this value, we can calculate three different beam radii.
1. $\delta_i = 2.83\ C_s 1/4 \lambda 3/4$ in the gaussian image plane (geometrical)
2. $\delta_g = 0.70\ C_s 1/4 \lambda 3/4$ in the best image plane (geometrical)
3. $\delta_0 = 0.43\ C_s 1/4 \lambda 3/4$ in the best image plane (wave optical)

If the above-described reference lens is used with 75 Kv electrons, $\lambda = 0.0559$ Å
$\alpha_0 = 15.37$ mr
$\sigma_i = 14.55$ Å
$\sigma_g = 3.599$ Å, and
$\sigma_0 = 2.21$ Å.

Figure 1:
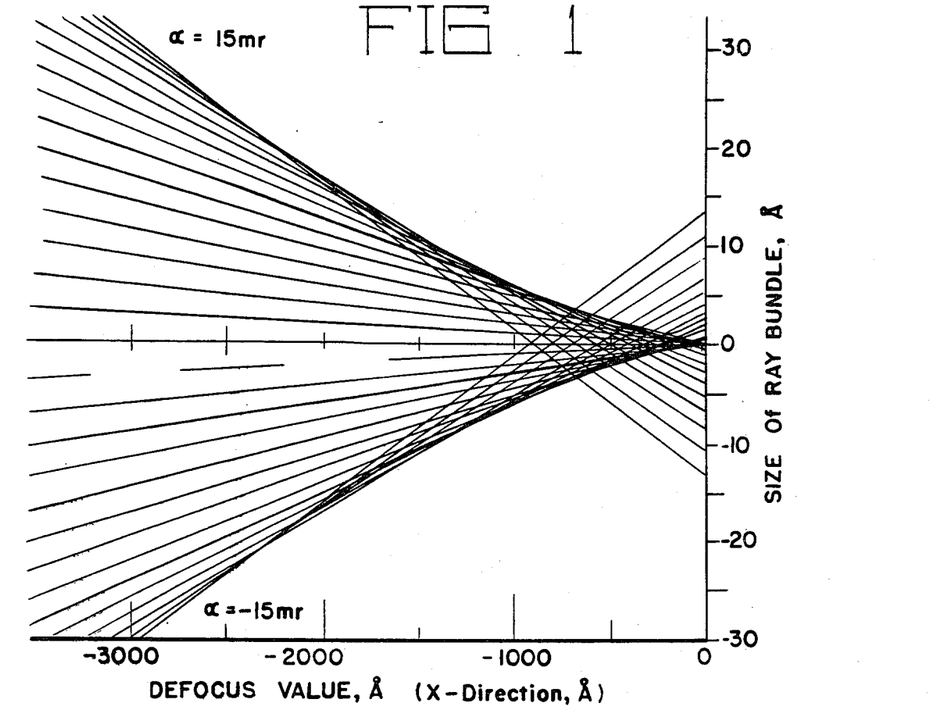
FIG. 1 shows a bundle of rays coming to focus in a reference lens.

FIG. 1 indicates the performance of this particular lens calculated geometrically. This figure shows the image size of a ray bundle as a function of defocus value, as measured from the image plane of a reference lens. The rays are shown at intervals of 1 mr up to a maximum of 15 mr. This set of rays or "ray bundle" shows the expected difference between $\sigma_i$ and $\sigma_g$ and the position of the minimum in $\sigma_g$ at about 700 Å under focus.

In order to reduce the diffraction limited resolution, the semi-angle of convergence $\alpha$ must be increased. In particular, if an ultimate goal of achieving a 1 Å resolution is to be realized, this angle must be increased to approximately 30 mr. This, in turn, will increase $\sigma_i$ by a factor of 8 which, in the absence of a corrector, would introduce 16 wavelengths of spherical aberration. Any correction device must then achieve a reduction of about a factor of 16 in the values of $\sigma_i$ or $\sigma_g$.

The correction system according to the invention comprises two sextupoles with an intermediate focusing lens, wherein a beam crossover is provided in the center of each sextupole. This system provides the desired reduction in $\sigma_i$ or $\sigma_g$, such that it provides reduced probe size and increased image magnification levels.

Figure 2:
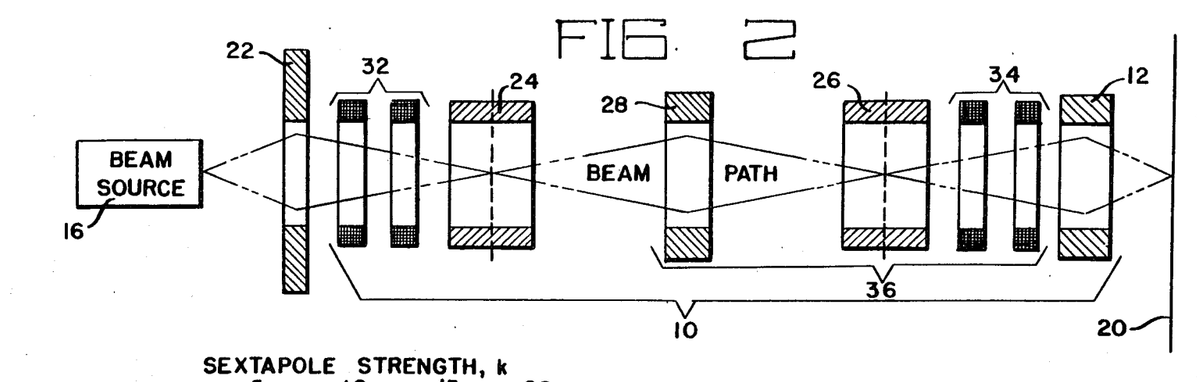
FIG. 2 shows a multiple sextupole system constructed according to the invention.

Referring to FIG. 2, there is shown one embodiment of a charged particle beam device utilizing two sextupoles and an intermediate weak lens to eliminate spherical and higher order aberration. A correction means 10 is provided for a principle lens 12 which focuses a particle beam 14 from beam source 16, on final image plane 20. Correction means 10 comprises focusing lens 22, sextupoles 24, 26 and an intermediate lens 28, positioned between sextupoles 24, 26.

In practice, adjustments must be made so that the particle beam passes accurately along the optical axis 30. These adjustments can be obtained by electrically controlling steering coil pairs 32 and 34. The same effect could be produced by physical movement of sextupoles 24, 26, and intermediate lens 28. Lenses 22, 28 focus beam path 14 at the centers of sextupoles 24, 26 so as to eliminate the second order aberrations of those sextupoles. For a given system with defined sextupole lengths and a defined distance between the centers of elements 26, 12, the average strength of sextupoles 24, 26 can be chosen so as to correct third order aberration in principle lens 12. The design of such a system for correcting third order aberration, designated by the numeral 36, was shown and described in U.S. Pat. No. 4,303,864 an invention of Dr. Albert Crewe, inventor of the present invention, and David A. Kopf, issued Dec. 1, 1981. In that application, mathematical relationships were defined for the sextupole strength values which provide the described third order aberration correction. However, after the average strength of sextupoles 24, 26 is adjusted, a large sized higher order radially asymmetric aberration results. By decreasing the strength of down stream sextupole 26 relative to upstream sextupole 24, and maintaining the required average overall strength of sextupoles 24, 26, a significant reduction in the size of higher order aberrations is obtained.

Figure 3:
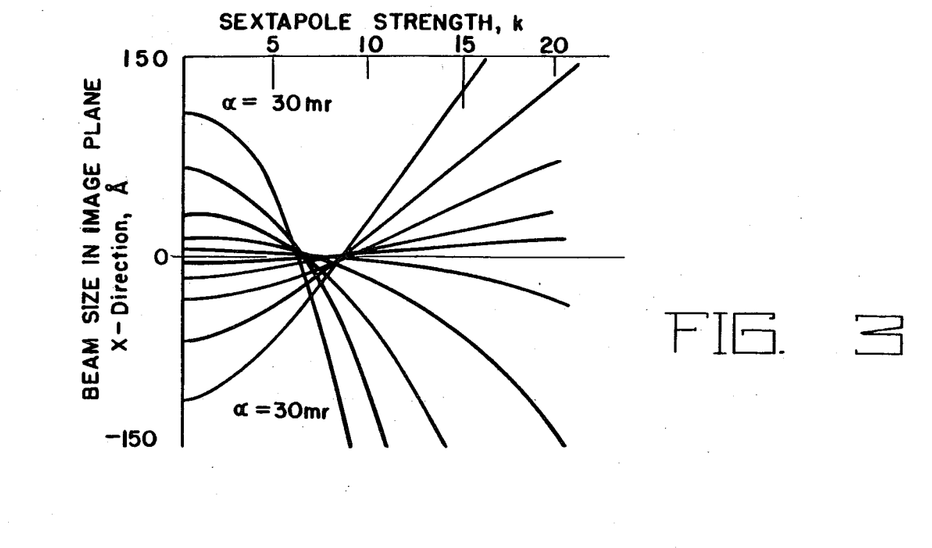
FIG. 3 shows a plot of beam size vs. sextupole strengths in a two sextupole system, sextupoles of equal strength.
Figure 4A:
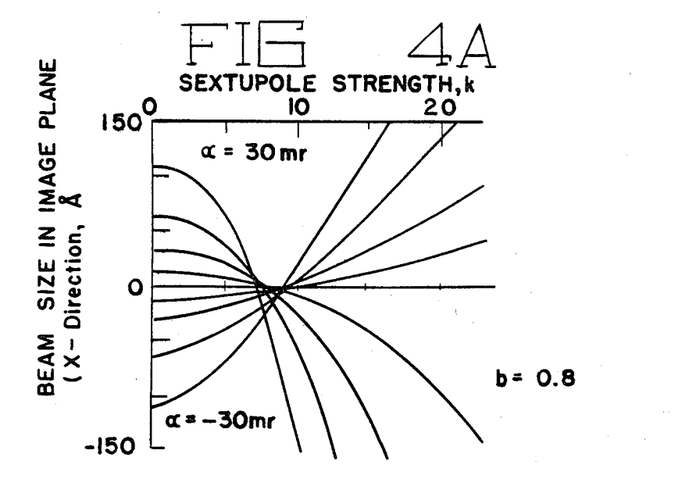
FIGS. 4a–4d show plots of beam size vs. sextupole strength in a two sextupole system, sextupoles operated at difference strengths.
Figure 4B:
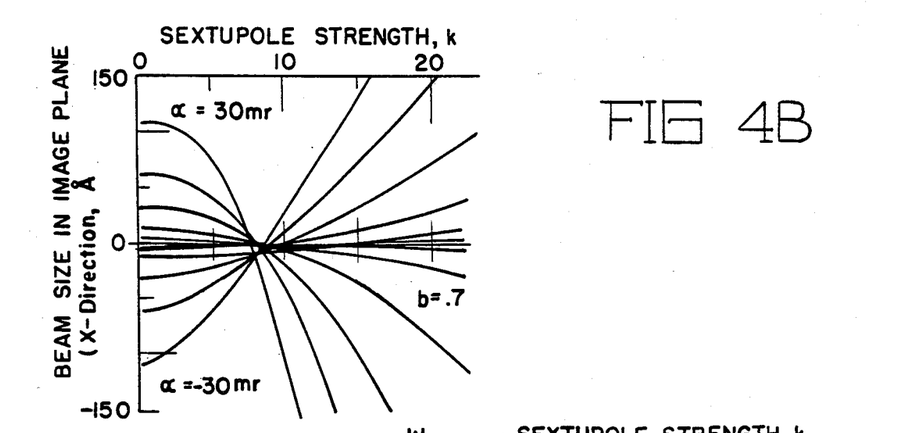
Figure 4C:
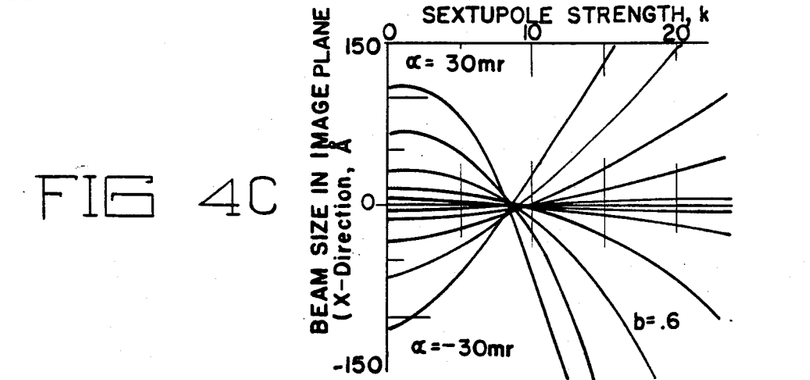
Figure 4D:
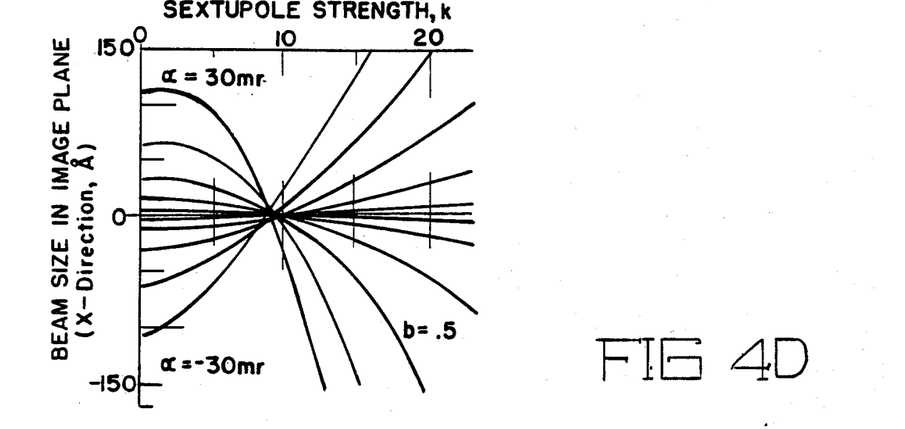

The effect of such a system in the image plane of a round lens is shown in FIG. 3 as a function of the strength of the sextupoles, both sextupoles being held at equal strengths. The effect i.e. the size of the beam in an image plane of a round lens, shown for various values of $\alpha$ ranging from $-30$ mr to $+30$ mr depicts an improvement over single sextupole systems, but higher order aberrations are significant.

Figure 5:
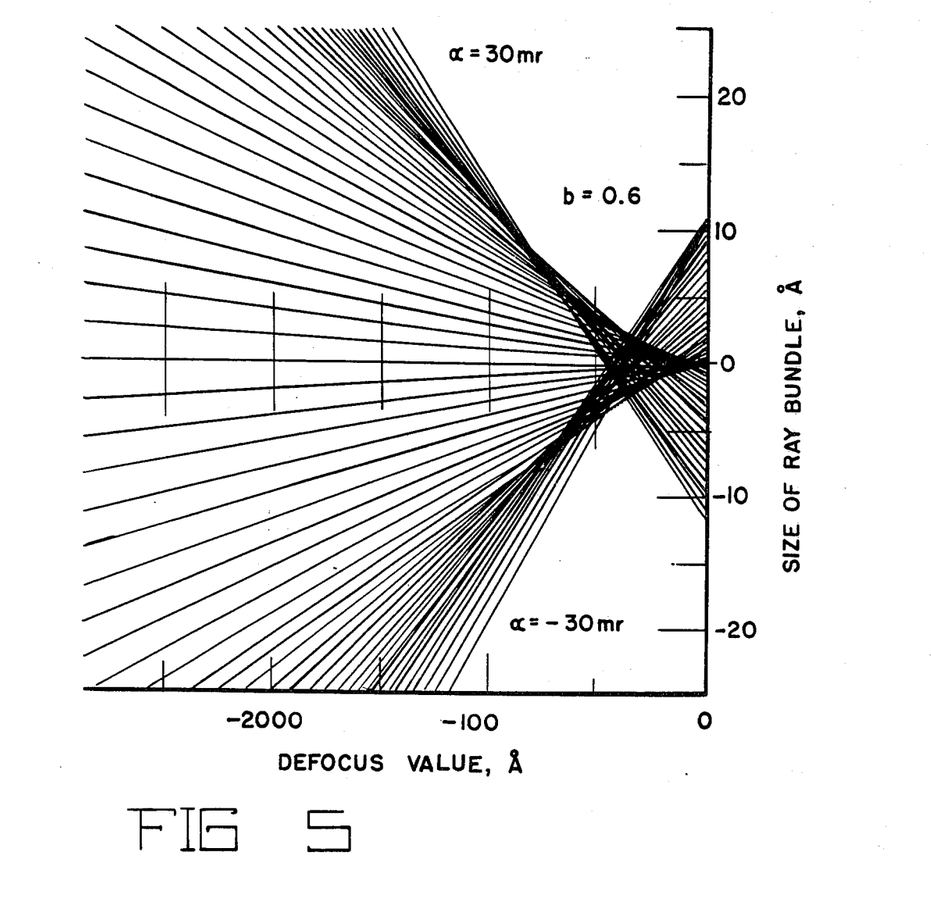
FIG. 5 shows a bundle of rays coming to focus in a reference lens after multiple sextupole correction.
Figure 6A:
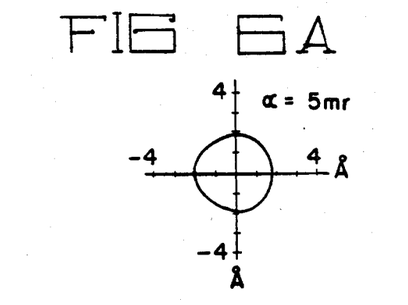
FIGS. 6a–6f show intercepts of rays in an image plane for varying convergence, angles, $\alpha$.
Figure 6B:
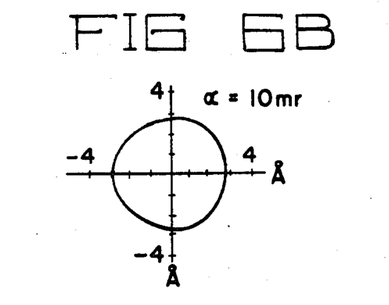
Figure 6C:
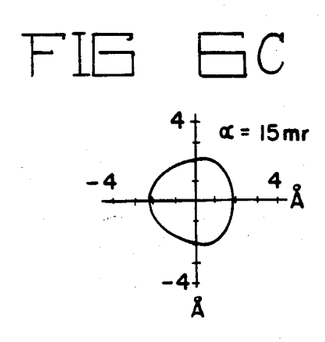
Figure 6D:
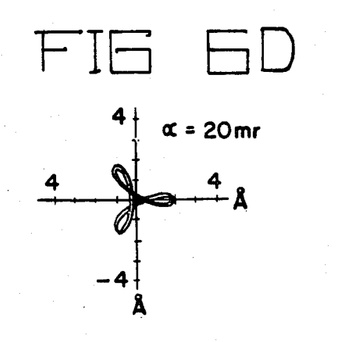
Figure 6E:
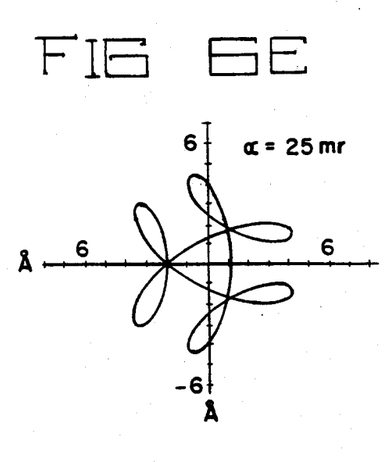
Figure 6F:
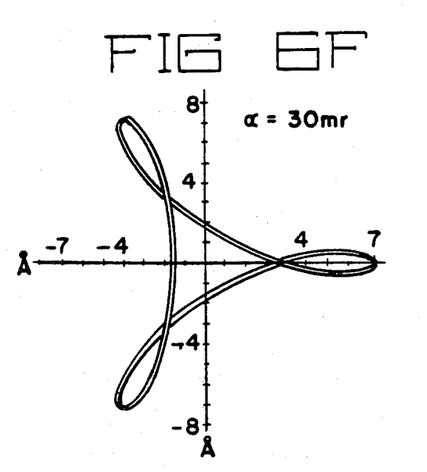
Figure 7:
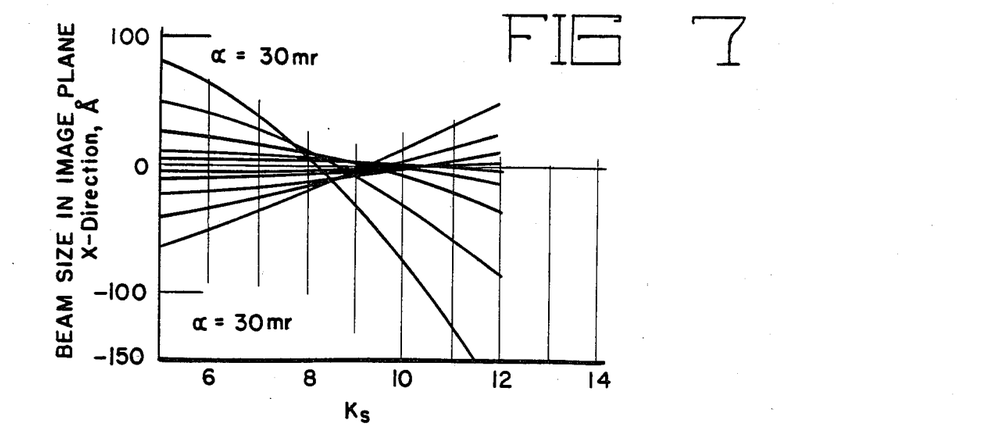
FIG. 7 shows a plot of beam size vs. sextupole strength for a two sextupole system, sextupoles of unequal strength.

According to the invention, the sextupoles are operated at unequal strengths, so that the noncylindrically symmetric input to the downstream sextupole will be acted upon so as to interact with third order aberrations of the input in precisely the same manner as a round lens, but in a direction opposite thereto. FIGS. 4a–4d show various arrangements of upstream sextupole strengths k, and downstream sextupole strengths bk. Using a value of b=0.6 and choosing values of k in the range 8 to 8.2, ray bundles were constructed to find, using analytical techniques, the optimum image position for the system described above. The best position, ($S_{min}$), shown in FIG. 5, is for b=0.6, k=8 which shows a beam approximately 2 Å in radius at a defocus value of about 400 Å. As in FIG. 1, image size is plotted as a function of defocus value for a range of $\alpha$ from $-30$ mr to $+30$ mr. The beam shape at this position ($S_{min}$) was calculated analytically using $\alpha = 5, 10 \ldots, 30$ mr. The results are shown in FIGS. 6a–6f. It can be seen that the beam is almost cylindrically symmetric up to $\alpha = 15$ mr and thereafter becomes double-valued with a three-lobed appearance. Nevertheless, it would appear that such a system is usable up to $\alpha = 25$ mr. At this angle, the diffraction limited resolution would be about 1.36 Å. In FIG. 7, the size of the beam in the image plane of the lens is shown as a function of $k_s$ for b=0.6. The general shape of the curves is the same as in the more approximate calculations, and corresponds most closely to b=0.7 in those computations.

Figure 8:
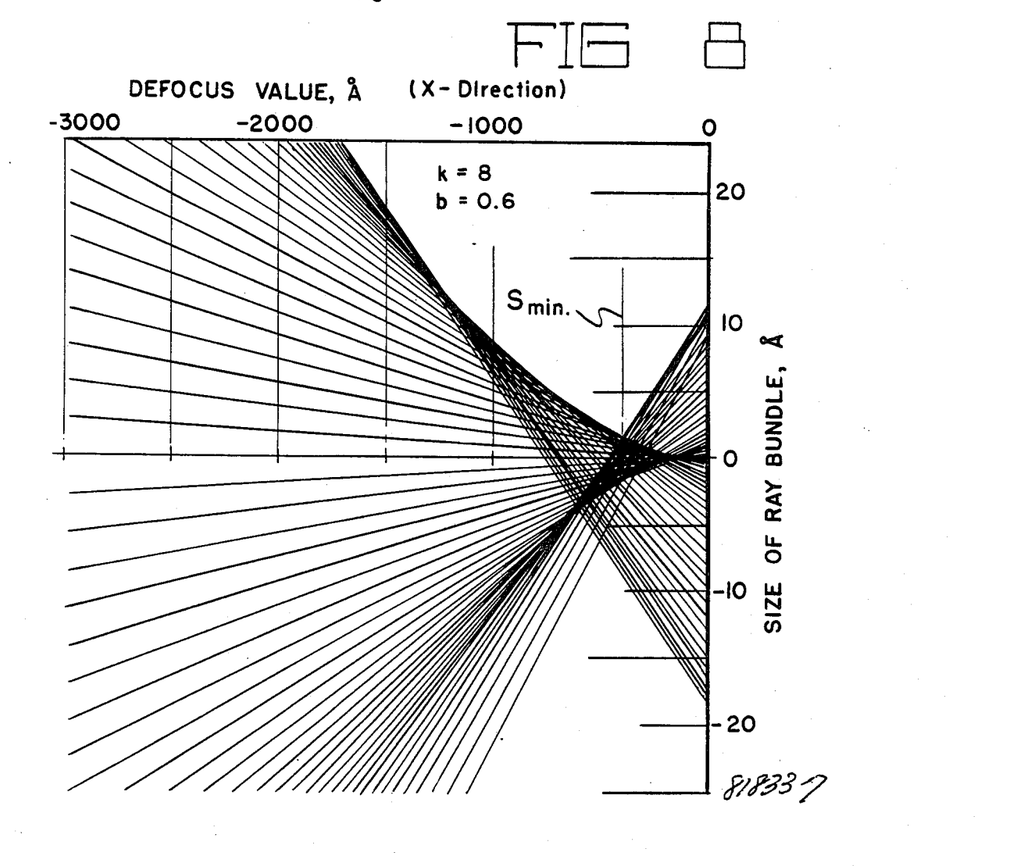
FIG. 8 shows a bundle of rays coming to focus in a reference lens after correction according to the invention.
Figure 9A:
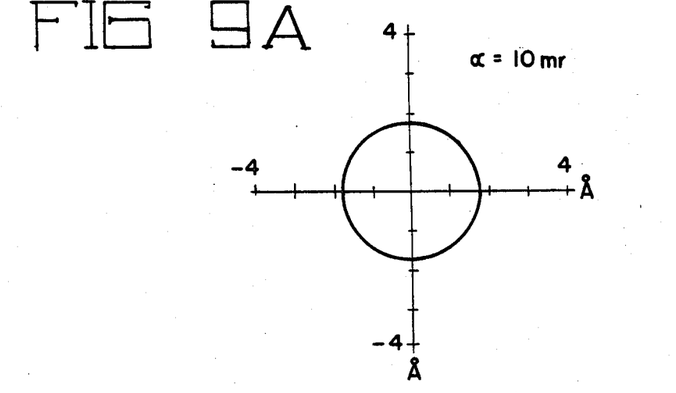
FIGS. 9a–9c show intercepts of rays in an image plane for varying convergence angles, $\alpha$, after multiple sextupole correction.
Figure 9B:
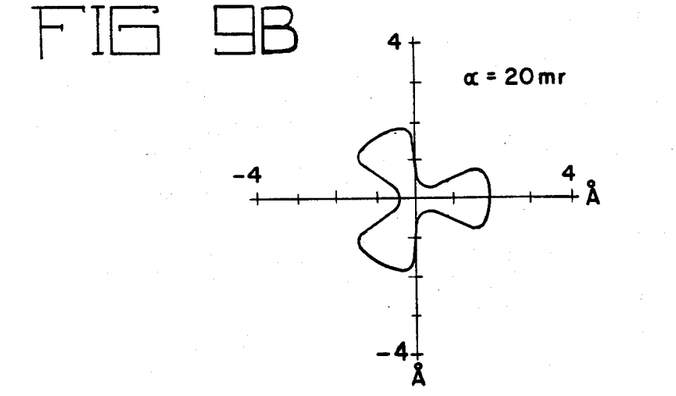
Figure 9C:
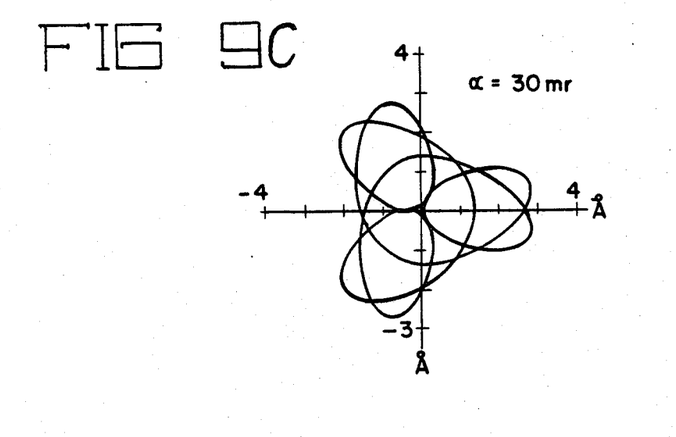

A complete digital solution of a ray bundle for k=8, b=0.6 is shown in FIG. 8. This corresponds most closely to k=9 in the previous case. Reasonable performance is found at k=8.5, b=0.5 with a 400 Å under focus condition ($S_{min}$). The shape of the beam at $S_{min}$, according to a complete digital numerical technique, is shown in FIGS. 9a–9c for $\alpha = 10$ mr, 20 mr, and 30 mr. The maximum geometrical radius of the beam is less than 3 Å for a 30 mr beam, a very substantial improvement over the case of no corrector (approximately a factor of 10). The final resolution is very close to the diffraction limit.

In summary, a principal lens was described above as having a focal length of 0.1 cm, a coefficient of spherical aberration ($C_s$), of 0.04 cm, and a semiangle of convergence of 15 mr. In order to increase the diffraction limited resolution of the lens, the semiangle of convergence of the lens must be doubled, resulting in an eight-fold increase of resolution, approximately 100 angstroms. Two sextupoles with an intermediate focusing lens were added to the above system. While maintaining an approximate equality of the strength of each sextupole, resolution was reduced to approximately 15 angstroms by correcting third order aberration in the principle lens, using techniques set forth in the aforementioned patent application of Albert V. Crewe and David A. Kopf. Then, by decreasing the strength of the downstream sextupole while maintaining the overall sextupole strength constant, resolution was reduced to approximately 2 angstroms for the above-described system. The ratio of downstream to upstream sextupole strengths was set at 60 percent, with an upstream sextupole strength of 8.0. According to the invention, the sextupole strength ratio can range from 40% to 80% depending primarily upon the length of the sextupoles and the distance between the focal planes of the downstream sextupole and the principle lens elements. The ratios for a particular system must be held within a fraction of a percent, typically to within a few parts in a thousand. The strengths of each sextupole must also be held to the same tolerances.

I claim:

1. In an electron beam device having a source of electrons, the improvement in the device for correcting higher order aberration, comprising: first and second sextupoles, each for focusing a beam in an image plane, and each having a second-order astigmatism distribution, an intermediate lens positioned between said first and said second sextupoles for focusing the beam to a point in the center of said second, sextupole, a first lens for focusing the beam to a point in the center of said first, sextupole, and a second lens positioned in said image plane of said second, sextu-pole for focusing the beam to a point in a final image plane.

2. The device of claim 1 wherein said first and said second focusing means comprise first and second sextupoles, respectively.

3. The device of claim 2, wherein said second sextupole is located downstream of said first sextupole and has between 40% and 80% of the strength of said first sextupole.

4. The device of claim 2, further including steering means for aligning said beam along the optical axis of the device.

5. The device of claim 4 wherein said steering means includes two pairs of steering coils with one pair of coils positioned upstream of said first sextupole and the second pair of coils positioned downstream of said second sextupole.

6. The device of claim 3, wherein said second lens has a focal length of 1 mm, a value of spherical aberration coefficient of 0.4 mm, and the source produces 75,000 volt electrons.

* * * * *